(12) United States Patent
Lee et al.

(10) Patent No.: US 10,670,900 B2
(45) Date of Patent: Jun. 2, 2020

(54) LIQUID-CRYSTAL DISPLAY DEVICE WITH REDUCED BRIGHTNESS DIFFERENCE BETWEEN FRONT AND SIDES

(71) Applicant: Samsung Display Co., Ltd., Yongin-si (KR)

(72) Inventors: Won Jun Lee, Changwon-si (KR); Doo Hwan You, Seoul (KR); Young Goo Song, Asan-si (KR); Youn Hak Jeong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 58 days.

(21) Appl. No.: 15/926,950

(22) Filed: Mar. 20, 2018

(65) Prior Publication Data

US 2019/0146250 A1 May 16, 2019

(30) Foreign Application Priority Data

Nov. 16, 2017 (KR) .......................... 10-2017-0153204

(51) Int. Cl.
*G02F 1/1333* (2006.01)
*G02F 1/1337* (2006.01)
(Continued)

(52) U.S. Cl.
CPC .... *G02F 1/133345* (2013.01); *G02F 1/13394* (2013.01); *G02F 1/133707* (2013.01);
(Continued)

(58) Field of Classification Search
CPC ... G02F 1/133345; G02F 2001/133357; G02F 2202/02; G02F 1/134336; G02F 2201/123;
(Continued)

(56) References Cited

U.S. PATENT DOCUMENTS 5,808,712 A * 9/1998 Hishida ............. G02F 1/133526
349/138
6,441,873 B2 * 8/2002 Young ............... G02F 1/136227
349/43
(Continued)

FOREIGN PATENT DOCUMENTS

| KR | 10-2006-0047023 | 5/2006 |
| KR | 10-2015-0016014 | 2/2015 |
| KR | 10-2019-0014612 | 2/2019 |

OTHER PUBLICATIONS

Su Jeong Kim et al., "Development of a resistivity division driving method for the vertically placed RGB pixels of the eight-domain thin-film-transistors liquid crystal display", Journal of Information Display, Mar. 19, 2013, pp. 93-96, vol. 14, No. 3., Taylor & Francis.
(Continued)

*Primary Examiner* — Paisley L Wilson
(74) *Attorney, Agent, or Firm* — H.C. Park & Associates, PLC (57) ABSTRACT

A liquid-crystal display device includes: a substrate on which a plurality of pixels is defined, wherein each of the pixels includes an active area where transmittance of light is controlled; an organic layer disposed on the substrate; and a pixel electrode disposed on the organic layer. The active area comprises a first area, a second area and a third area, the second and third areas are connected to the first area on both sides thereof, respectively, when viewed from a top, and the organic layer is disposed only in the first area.

18 Claims, 7 Drawing Sheets

(51) Int. Cl.
*G02F 1/1343* (2006.01)
*G02F 1/1339* (2006.01)
*H01L 27/12* (2006.01)

(52) U.S. Cl.
CPC .... *G02F 1/134336* (2013.01); *H01L 27/1248* (2013.01); *G02F 2001/13398* (2013.01); *G02F 2001/133357* (2013.01); *G02F 2201/123* (2013.01); *G02F 2202/02* (2013.01); *G02F 2202/42* (2013.01)

(58) Field of Classification Search
CPC ......... G02F 2201/122; G02F 1/133707; G02F 1/133553; G02F 1/133555
See application file for complete search history.

(56) References Cited

U.S. PATENT DOCUMENTS

| | | | |
|---|---|---|---|
| 8,174,647 B2* | 5/2012 | Ge | G02F 1/133345 |
| | | | 349/114 |
| 2010/0026941 A1* | 2/2010 | Umeno | G02F 1/133555 |
| | | | 349/114 |
| 2014/0253859 A1* | 9/2014 | Yoon | G02F 1/134336 |
| | | | 349/144 |
| 2019/0041675 A1 | 2/2019 | Jeong et al. | |

OTHER PUBLICATIONS

Hoon Kim et al., "New three-gamma-curves-integrated VA LCD design for excellent image quality and enhanced transmittance", Journal of Information Display, Apr. 1, 2015, pp. 109-115, vol. 17, No. 3., Taylor & Francis.

* cited by examiner

LIQUID-CRYSTAL DISPLAY DEVICE WITH REDUCED BRIGHTNESS DIFFERENCE BETWEEN FRONT AND SIDES

CROSS REFERENCE TO RELATED APPLICATION

This application claims priority from and the benefit of Korean Patent Application No. 10-2017-0153204, filed on Nov. 16, 2017, which is hereby incorporated by reference for all purposes as if fully set forth herein.

BACKGROUND

Field

Exemplary embodiments of the invention relate generally to a liquid-crystal display (LCD) device.

Discussion of the Background

A liquid-crystal display (LCD) device is composed of two substrates on which electric field generating electrodes such as pixel electrodes and common electrodes are formed, and a liquid-crystal layer injected between the two substrates. Voltage is applied to the electric field generating electrodes to form an electric field in the liquid-crystal layer, such that the orientation of the liquid crystals contained in the liquid-crystal layer is aligned and the polarization of incident light is controlled, to display images.

Among these LCD devices, a vertically aligned (VA) mode LCD is under development in which the major axes of liquid-crystal molecules are oriented perpendicular to the upper and lower substrates when no electric field is applied.

The above information disclosed in this Background section is only for understanding of the background of the inventive concepts, and, therefore, it may contain information that does not constitute prior art.

SUMMARY

Devices constructed according to exemplary embodiments of the invention are capable of reducing the difference in brightness between the front and the sides in VA-mode liquid-crystal display devices to thereby improve the visibility.

Typically, the image quality of a VA-mode liquid-crystal display device is poor when viewed from the sides compared to the front. Specifically, images are brighter when the liquid-crystal display device is viewed from the front than when it is viewed from the sides. The larger the difference in brightness is, the more visibility deteriorates.

Accordingly, exemplary embodiments provide a liquid-crystal display device with improved visibility.

According to an exemplary embodiment of the invention, a liquid-crystal display device includes: a substrate on which a plurality of pixels is defined, wherein each of the pixels includes an active area where transmittance of light is controlled; an organic layer disposed on the substrate; and a pixel electrode disposed on the organic layer. The active area may include a first area, a second area and a third area, wherein the second and third areas are connected to the first area on both sides thereof, respectively, when viewed from a top, and the organic layer may be disposed only in the first area.

According to another exemplary embodiment, a liquid-crystal display device includes: a substrate on which a plurality of pixels are defined, wherein each of the pixels includes an active area where transmittance of light is controlled; an organic layer disposed on the substrate; and a pixel electrode disposed on the organic layer. The active area may include a first area and second and third areas, the second and third areas may be connected to the first area on both sides thereof, respectively, when viewed from a top, and a height of the organic layer disposed in the first area may be higher than a height of the organic layer disposed in each of the second area and the third area.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1:
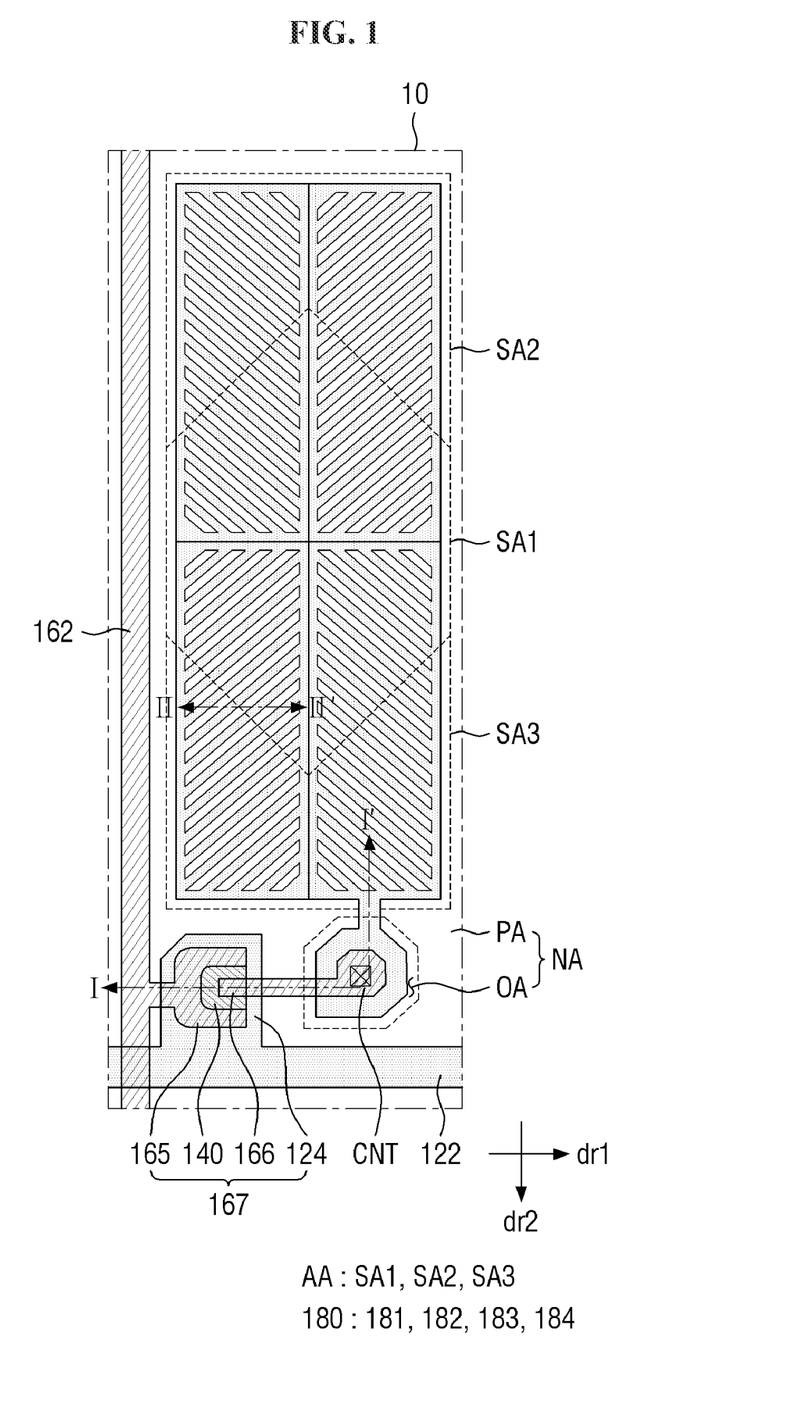
FIG. 1 is a layout diagram of a single pixel in a liquid-crystal display device according to an exemplary embodiment of the invention.
Figure 2:
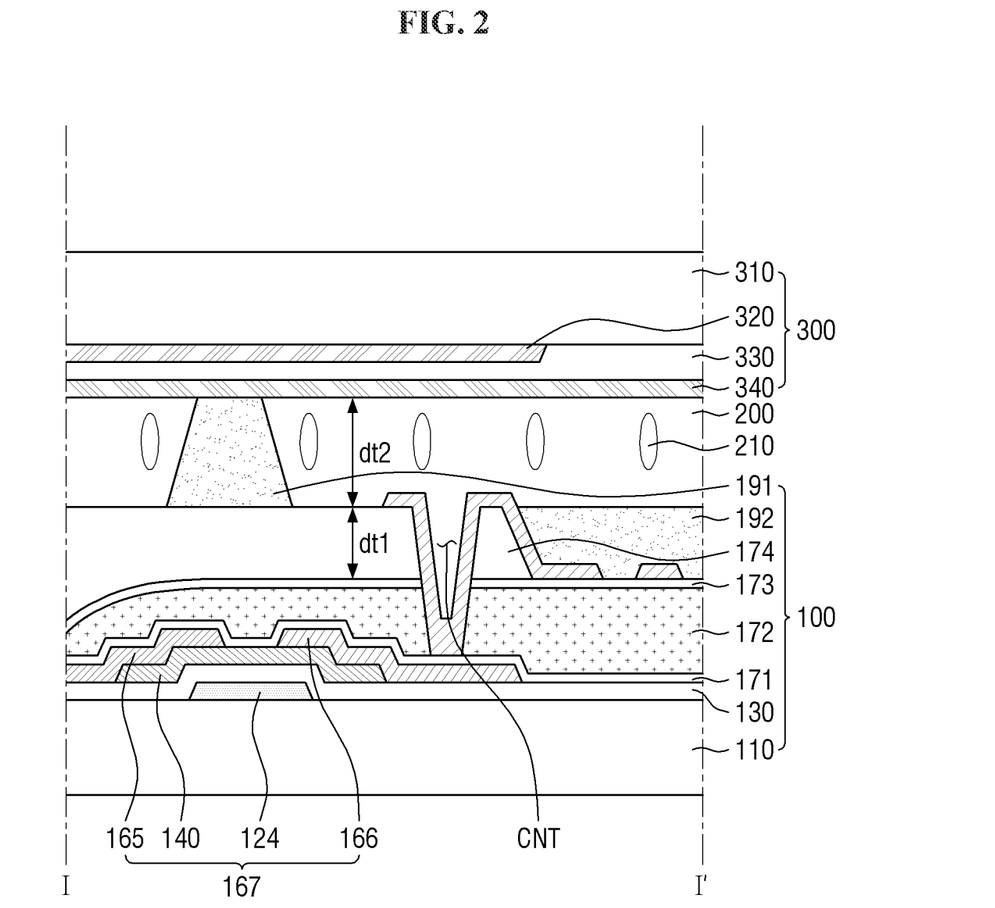
FIG. 2 is a cross-sectional view taken along line I-I' of FIG. 1.
Figure 3:
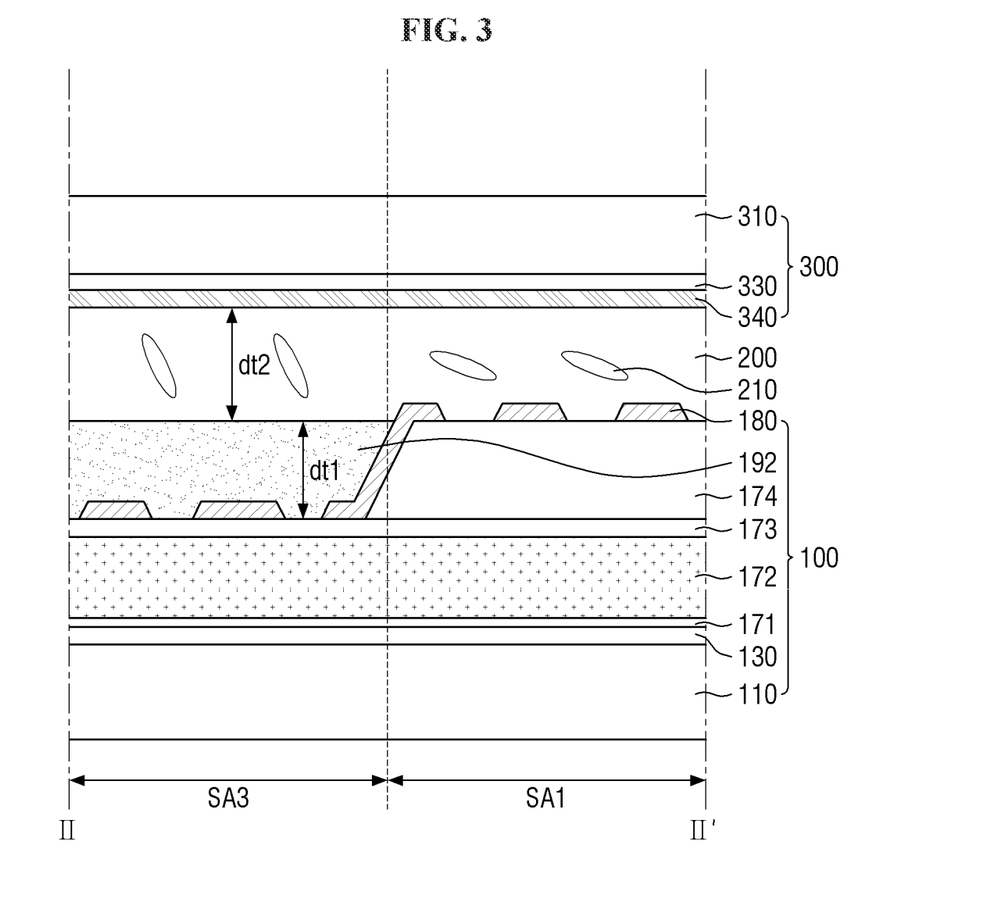
FIG. 3 is a cross-sectional view taken along line II-II' of FIG. 1.
Figure 4:
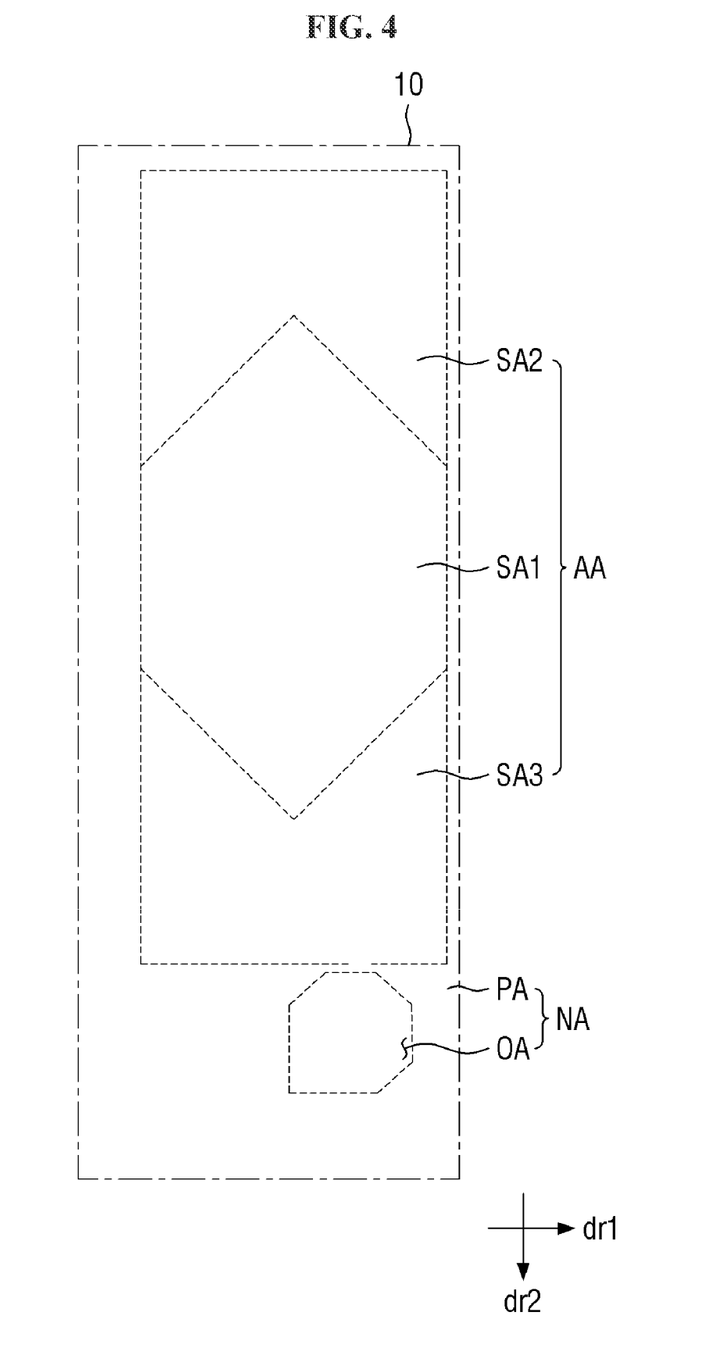
FIG. 4 is a layout diagram of an organic layer included in the pixel of FIG. 1.
Figure 5:
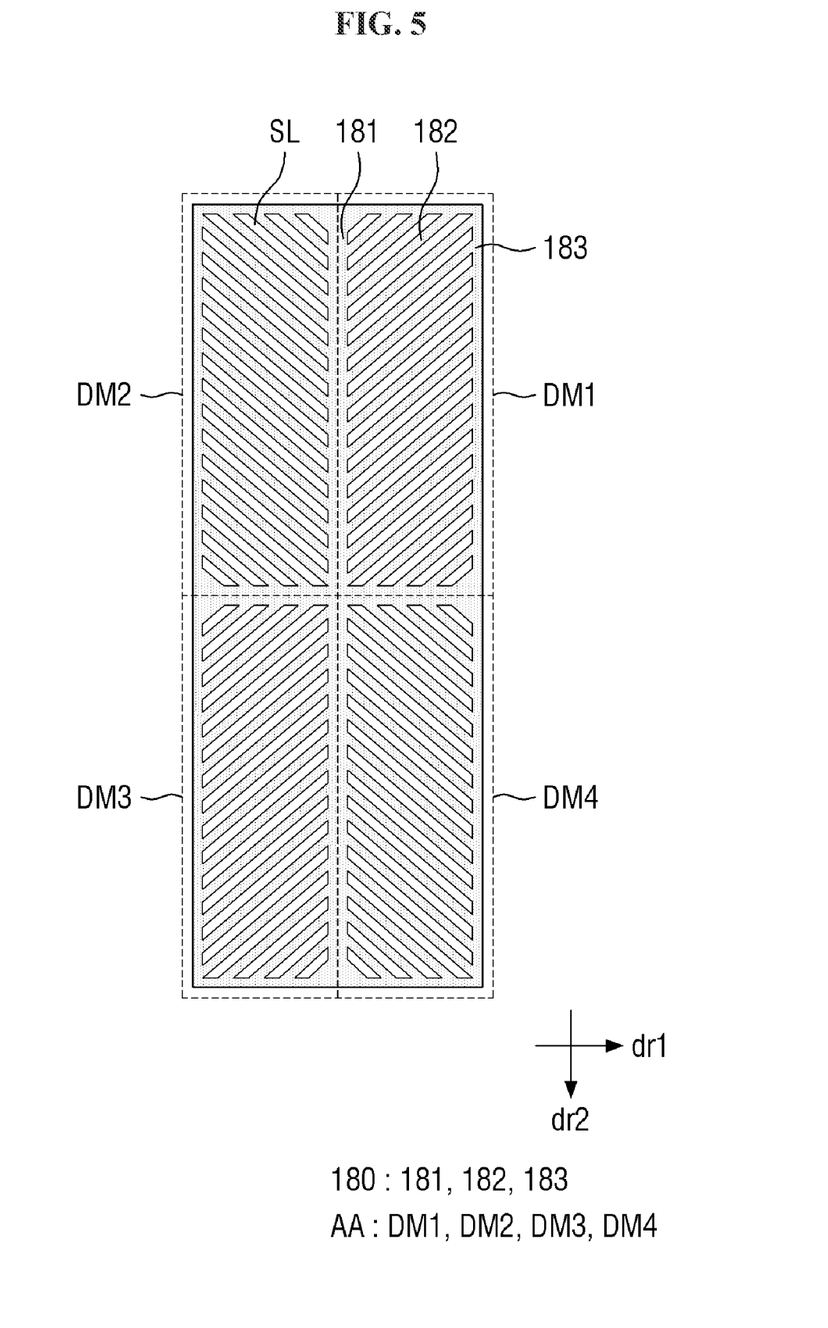
FIG. 5 is a layout diagram of the active area of FIG. 1.

FIG. 1 is a layout diagram of a single pixel in an LCD device according to an exemplary embodiment. FIG. 2 is a cross-sectional view taken along line I-I' of FIG. 1. FIG. 3 is a cross-sectional view taken along line II-II' of FIG. 1. FIG. 4 is a layout diagram of an organic layer included in the pixel of FIG. 1. FIG. 5 is a layout diagram of the active area of FIG. 1.

Referring to FIGS. 1, 2, 3, 4, and 5, an LCD device according to an exemplary embodiment includes a first display substrate 100, a second display substrate 300 and a liquid-crystal layer 200. The LCD device may further include a pair of polarizers (not shown) attached on outer surfaces of the first display substrate 100 and the second display substrate 300 or attached between them.

In the first display substrate 100, a switching element for changing the orientation of liquid-crystal molecules 210 in the liquid-crystal layer 200, e.g., a thin-film transistor 167 is disposed. The second display substrate 300 is disposed such that it faces the first display substrate 100.

The liquid-crystal layer 200 is interposed between the first display substrate 100 and the second display substrate 300 and may include liquid-crystal molecules 210 having dielectric anisotropy. When electric field is applied across the first display substrate 100 and the second display substrate 300, the liquid-crystal molecules 210 are tilted in a particular direction between the first display substrate 100 and the second display substrate 300 to thereby transmit or block light. Herein, the term rotation may refer not only to actual rotation of the liquid-crystal molecules 210 but also to a change in orientation of the liquid-crystal molecules 210 by the electric field.

The LCD device includes a plurality of pixels 10 arranged in a matrix. The gray scale of the pixels 10 can be individually controlled. Each of the pixels 10 may work as a unit for producing a particular color. Each of the pixels 10 includes an active area AA in which incident light from the bottom of the first display substrate 100 is transmitted toward the top of the second display substrate 300 such that colors are actually displayed.

Hereinafter, the first display substrate 100 will be described.

The first display substrate 100 includes a first base substrate 110. The first base substrate 110 may be a transparent insulation substrate. For example, the first base substrate 110 may be a glass substrate, a quartz substrate, a transparent resin substrate, etc.

In some embodiments, the first base substrate 110 may be curved in a direction. In some other embodiments, the first base substrate 110 may have flexibility. That is, the first base substrate 110 may be deformable so that it may be rolled, folded, bent and so on.

A gate line 122 and a gate electrode 124 are disposed on the first base substrate 110.

The gate line 122 transfers a gate voltage for controlling the thin-film transistor 167. The gate line 122 may be extended in a first direction dr1.

Herein, the first direction dr1 may be perpendicular to a second direction dr2 described later, and may be extended in a direction on the plane where the first base substrate 110 is disposed. For example, the first direction dr1 may be indicated by a straight line extending from the left to the right as shown in FIG. 1.

The gate voltage is applied from an external source and may have a variable voltage level. The thin-film transistor 167 may be turned on/off in response to the voltage level of the gate signal.

The gate electrode 124 may protrude from the gate line 122 and may be mechanically connected to the gate line 122. The gate electrode 124 may be one of the elements of the thin-film transistor 167 which will be described later.

The gate line 122 and the gate electrode 124 may be made of the same material. For example, the gate line 122 and the gate electrode 124 may include: an aluminum-based metal such as aluminum (Al) and an aluminum alloy; a silver-based metal such as silver (Ag) and a silver alloy; a gold-based metal such as copper (Cu) and a copper alloy; a molybdenum-based metal such as molybdenum (Mo) and a molybdenum alloy; chrome (Cr); tantalum (Ta); and titanium (Ti). The gate line 122 and the gate electrode 124 may have a single layer structure. Alternatively, the gate line 122 and the gate electrode 124 may have a multi-layer structure including at least two conductive films having different physical properties.

Although not shown in the drawings, conductive patterns may be additionally disposed on the layer where the gate line 122 and the gate electrode 124 are disposed and may be made of the same material as them. They may form a capacitance together with a pixel electrode 180, which will be described later, to prevent a sharp drop of the voltage level provided to the pixel electrode 180 or to prevent the light provided from the below from transmitting upwardly in certain regions.

A gate insulating layer 130 is disposed on the gate line 122 and the gate electrode 124. The gate insulation layer 130 may be made of an insulating material, for example, silicon nitride or silicon oxide. The insulating layer 130 may have a single layer structure or may have a multi-layer structure including two insulating layer having different physical properties.

A semiconductor layer 140 is disposed on the insulating layer 130. The semiconductor layer 140 may overlap with at least a part of the gate electrode 124. The semiconductor layer 140 may be made of amorphous silicon, polycrystalline silicon or oxide semiconductor.

The semiconductor layer 140 may overlap with a data line 162, a source electrode 165 and a drain electrode 166 to be described later, as well as the gate electrode 124.

Although not shown in the drawings, in some embodiments, an ohmic contact element may be additionally disposed on the semiconductor layer 140. The ohmic contact element may be, for example, made of n+ hydrogenated amorphous silicon that is highly doped with n-type impurities, or may be made of silicide. A pair of the ohmic contact elements may be disposed on the semiconductor layer 140. The ohmic contact elements may be disposed between the source electrode 165 and the semiconductor layer 140 and between the drain electrode 166 and semiconductor layer 140, so that they have ohmic contact characteristics. When the semiconductor layer 140 includes oxide semiconductor, the ohmic contact element may be eliminated.

On the semiconductor layer 140 and the first insulating layer 130, the data line 162, the source electrode 165 and the drain electrode 166 are disposed.

The data line 162 may be extended in a second direction dr2 to intersect with the gate line 122.

The data line 162 may be insulated from the gate line 122 and the gate electrode 124 by the insulating layer 130.

The data line 162 may provide a data voltage to the source electrode 165. The data voltage may be applied from an external source and may have a variable voltage level. The gray scale of each of the pixels 10 may vary in response to the level of the data voltage.

The source electrode 165 may branch off from the data line 162 and may overlap with at least a part of the gate electrode 124.

In the perspective of FIG. 1, the drain electrode 166 may be spaced apart from the source electrode 165 with the semiconductor layer 140 therebetween and may overlap with the gate electrode 124 at least partially.

As shown in FIG. 1, the source electrode 165 may be spaced apart from the drain electrode 166 by a predetermined gap and may have a C-shape such that it surrounds the drain electrode 166. However, this is merely illustrative. Alternatively, the source electrode 165 and the drain electrode 166 may have a rod-like shape such that they are spaced apart from each other in parallel. In other words, the shapes of the source electrode 165 and the drain electrode 166 are not particularly limited herein as long as they are spaced apart from each other with a predetermined spacing therebetween.

The data line 162, the source electrode 165 and the drain electrode 166 may be made of the same material. For example, the data line 162, the source electrode 165 and the drain electrode 166 may be made of aluminum, copper, silver, molybdenum, chrome, titanium, tantalum or an alloy thereof. In addition, they may have, but is not limited to, a multi-layer structure comprised of a lower layer (not shown) such as a refractory metal and a low-resistance upper layer (not shown) formed on the lower layer.

The gate electrode 124, the semiconductor layer 140, the source electrode 165 and the drain electrode 166 form the switching element, i.e., the thin-film transistor 167.

A first passivation layer 171 is disposed on the insulating layer 130 and the thin-film transistor 167. The first passivation layer 171 may be made of an inorganic insulating material and may cover the thin-film transistor 167. The first passivation layer 171 may protect the thin-film transistor 167 and may prevent materials contained in a color filter layer 172 and a material thereon, which are described below, from being introduced into the semiconductor layer 140. In some embodiments, the first passivation layer 171 may be eliminated.

The color filter layer 172 is disposed on the first passivation layer 171. The color filter layer 172 may be a photosensitive organic composition containing a pigment for reproducing a color and may include one of red, green or blue pigments. For example, the color filter layer 172 may include a plurality of color filters. For example, each of the plurality of color filters may reproduce one of primary colors including red color, green color and blue color. However, this is merely illustrative. Each of the plurality of color filters may reproduce one of cyan, magenta, yellow and white colors.

A second passivation layer 173 is disposed on the color filter layer 172. The second passivation layer 173 may be made of an inorganic insulating material and may cover the color filter layer 172. The second passivation layer 173 may prevent a material contained in the color filter layer 172 from being introduced into the elements thereabove. In some embodiments, the second passivation layer 173 may be eliminated.

An organic layer 174 is disposed on the second passivation layer 173. The organic layer 174 may be made of an organic material and may be patterned in each of the pixels 10 to have a specific pattern. In particular, the organic layer may be formed only in a part of the active area AA, so that the pixel electrode 180 described later may have a level difference.

More specifically, each of the pixels 10 includes an active area AA and a non-active area NA. As described above, the active area AA transmits incident light from the bottom of the first display substrate 100 toward the top of the second display substrate 300 such that colors are actually displayed therein. On the other hand, the non-active area NA blocks the light by components having the nature of blocking light or the liquid-crystal molecules 210 arranged to block light so that the light does not transmit toward the top of the second display substrate 300.

The active area AA includes a first area SA1, a second area SA2, and a third area SA3. The first area SA1 may be disposed between the second area SA2 and the third area SA3 and may have a hexagonal shape as shown in FIG. 4. In some embodiments, the first area SA1 may have a diamond shape. However, the shape of the first area SA1 is not limited to those described above. The shape of the organic layer 174 when viewed from the top will be described later.

The second area SA2 and the third area SA3 are disposed on both sides of the first area SA1, respectively. As shown in FIGS. 1, 4 and 5, the second area SA2 may be in contact with the first area SA1 on its upper side while the third area SA3 may be in contact with the first area SA1 on its lower side.

The non-active area NA includes an opening area OA and a peripheral area PA. The opening area OA may correspond to a region where a contact hole CNT electrically connecting the pixel electrode 180 with the drain electrode 166 to be described later is formed. The peripheral area PA may refer to all areas other than the opening area OA and the active area AA. For example, the gate line 122, the gate electrode 124, the semiconductor layer 140, the data line 162, and the source electrode 165 may be disposed in the peripheral area PA.

The organic layer 174 may be disposed in the active area AA and in a part of the non-active area NA. More specifically, the organic layer 174 may be disposed in the first area SA1 in the active area AA and in the peripheral area PA in the non-active area NA.

It is to be noted that the organic layer 174 is disposed only in the first area SA1 but not in the second area SA2 and the third area SA3 in the active area AA, such that a level difference can be created in a part of the active area AA. That is, the upper surface of the organic layer 174 disposed in the first area SA1 has a level higher than the level of the upper surface of the organic layer 174 disposed in the second and third areas SA2 and SA3 by the height dt1 of the organic layer 174. As the organic layer 174 has such structure, the distance from the first base substrate 110 to the pixel electrode 180 and to the common electrode 340 measured in the direction vertical to the first base substrate 110 may differ in the first area SA1 and in the second and third areas SA2 and SA3. Accordingly, even if only one voltage level is provided to the pixel electrode 180, the liquid-crystal molecules 210 can be control at different inclinations in the first area SA1 and in the second and third areas SA2 and SA3. As a result, the visibility can be improved.

The height dt1 of the organic layer 174 may be 0.5 μm or more. Thus, the level difference created by the organic layer 174 between the first area SA1 and the second and third areas SA2 and SA3 may be 0.5 μm or more. Particularly, when the height dt1 of the organic layer 174 is 1 μm or more and accordingly the level difference created by the organic layer 174 between the first area SA1 and the second and third areas SA2 and SA3 is 1 μm or more, the visibility can be most improved.

In some embodiments, the organic layer 174 may not be disposed in the peripheral region PA, either.

In the passivation layer 171, the color filter layer 172, the second passivation layer 173 and the organic layer 174, a contact hole CNT may be formed, via which a part of the thin-film transistor 167, more specifically a part of the drain electrode 166 is exposed in the direction perpendicular to the first base substrate 110. The contact hole CNT may be formed by penetrating the first passivation layer 171, the color filter layer 172, the second passivation layer 173 and the organic layer 174.

The pixel electrode 180 is disposed on the organic layer 174. The pixel electrode 180 may be mechanically connected to the drain electrode 166 via the contact hole CNT and may receive the data voltage from the drain electrode 166.

The pixel electrode 180 may be made of a transparent conductive material such as indium tin oxide (ITO), indium zinc oxide (IZO), indium tin zinc oxide (ITZO), Al-doped zinc oxide (AZO).

The pixel electrode 180 may be disposed generally in the active area AA, but may include an area extended to overlap the contact hole CNT for connection with the drain electrode 166.

The area where the pixel electrode 180 is disposed may be divided into a plurality of areas. More specifically, the active area AA may be divided in another way in addition to the above-described first area SA1, second area SA2 and third area SA3. That is, the active area AA may be divided into four areas. These four areas may correspond to four quadrants of the active area AA. Among the areas, the area corresponding to upper right quadrant is defined as a first domain DM1, the area corresponding to upper left quadrant is defined as a second domain DM2, the area corresponding to lower left quadrant is defined as a third domain DM3, and the area corresponding to lower right quadrant is defined as a fourth domain DM4.

The first domain DM1, the second domain DM2, the third domain DM3 and the fourth domain DM4 may have the same area and the same shape.

The pixel electrode 180 may include slits SL which are openings where no transparent conductive material is disposed. By virtue of the slits SL, a regular pattern is formed in the pixel electrode 180. The direction and degrees that the liquid-crystal molecules 210 above the pixel electrode 180 are tilted may be controlled by the shape and the pattern of the pixel electrode 180.

The pixel electrode 180 includes stem electrode 181, branch electrodes 182, connecting electrodes 183 and an extension electrode 184.

The elements of the pixel electrode 180 may be disposed in the active area AA. Exceptionally, however, the extension electrode 184 may be disposed outside the active area AA.

The stem electrode 181 may include portions extending in the first direction dr1 and portions extending in the second direction dr2. Each of the portions of the stem electrode may be disposed along the boundaries between two adjacent ones of the first to fourth domains DM1 to DM4. That is, the stem electrode 181 may be disposed on the boundary between the first domain DM1 and the second domain DM2, the boundary between the second domain DM2 and the third domain DM3, the boundary between the third domain DM3 and the fourth domain DM4, and the boundary between the fourth domain DM4 and the first domain DM1.

The plurality of branch electrodes 182 may be extended in directions inclined with respect to both the first direction dr1 and the second direction dr2, i.e., in directions not parallel with both the first direction dr1 and the second direction dr2. Each of the branch electrodes 182 may be extended in different directions in the first domain DM1, in the second domain DM2, in the third domain DM3, and in the fourth domain DM4. More specifically, as shown in FIG. 1, the plurality of branch electrodes 182 may be extended in the direction toward the upper right end in the first domain DM1, in the direction toward the upper left end in the second domain DM2, in the direction toward the lower left end in the third domain DM3, and in the direction toward the lower right end in the fourth domain DM4.

In the perspective of FIG. 1, the level difference of the organic layer 174 may be created perpendicularly to the direction in which the branch electrodes 182 are extended. That is, the boundary between the first area SA1 and the second area SA2 and the boundary between the first area SA1 and the third area SA3 may be perpendicular to the direction in which the branch electrodes 182 are extended.

For example, in the first domain DM1, since the branch electrodes 182 are extended toward the upper right end, the level difference of the organic layer 174 may be created in the direction toward the upper left. Likewise, in the second domain DM2, since the branch electrodes 182 are extended toward the upper left end, the level difference of the organic layer 174 may be created in the direction toward the upper right. In the third domain DM3, since the branch electrodes 182 are extended toward the lower left end, the level difference of the organic layer 174 may be created in the direction toward the lower right. In the fourth domain DM4, since the branch electrodes 182 are extended toward the upper right end, the level difference of the organic layer 174 may be created in the direction toward the lower left. In other words, the shape of the first area SA1 may be a hexagonal shape or a diamond shape as described above, which may be determined according to the directions in which the branch electrodes 182 are extended. Therefore, the shape of the first area SA1 is not limited thereto, and may have any shape as long as a level difference is formed in a direction perpendicular to the direction in which the branch electrodes 182 are extended in each of the domains.

The connecting electrode 183 may be disposed to connect the ends of the branch electrodes 182 to one another. Accordingly, the connecting electrode 183 may be disposed along the outer boundary of the first to fourth domains DM1 to DM4, that is, along the boundary of the active area AA. That is, the connecting electrode 183 may be disposed such that it surrounds the stem electrode 181 and the branch electrodes 182. In some embodiments, however, the connecting electrode 183 may be eliminated.

Incidentally, as described above, the pixel electrode 180 disposed in the first area SA1 may be disposed at a higher level than the level of the pixel electrode 180 disposed in the second area SA2 and the third area SA3 by the height dt1 of the organic layer 174.

A spacer 191 and a planarization layer 192 may be disposed on the pixel electrode 180.

The spacer 191 may maintain the spacing between the first display substrate 100 and the second display substrate 300. In other words, the spacer 191 may ensure a space between the first display substrate 100 and the second display substrate 300 where the liquid-crystal layer 200 is disposed. In some embodiments, the spacer 191 may overlap with at least a part of the thin-film transistor 167. The spacer 191 may be made of an organic material.

The planarization layer 192 may provide a flat surface over level differences created on the organic layer 174. In other words, the upper surface of the planarization layer 192 and the organic layer 174 may be substantially flat.

More specifically, the planarization layer 192 may be disposed in the second area SA2 and the third area SA3 of the active area AA where the organic layer 174 is not patterned and not disposed. In other words, the planarization layer 192 may be formed to cover the recessed regions formed in the second and third areas SA2 and SA3 due to the level difference of the organic layer 174. The upper surface of the planarization layer 192 and the upper surface of the organic layer 174 may have substantially the same level. The planarization layer 192 may be disposed to overlap the pixel electrodes 180 formed in the second area SA2 and the third area SA3.

Since the upper surface of the planarization layer 192 and the upper surface of the organic layer 174 are disposed at substantially the same level, it is possible to prevent that the liquid-crystal molecules 210 included in the liquid-crystal layer 200 described below are misaligned or tilted in unintended direction due to the level difference of the organic layer 174.

When the dielectric constant of the planarization layer 192 is higher than the dielectric constant of the liquid-crystal layer 200, the effect of improving the visibility by creating the level difference of the organic layer 174 can be further increased. Generally, the dielectric constant of a material is proportional to a change in the electric field. Therefore, if the dielectric constant of the planarization layer 192 is higher than the dielectric constant of the liquid-crystal layer 200, the planarization layer 192 can change the intensity of the electric field more than the liquid-crystal layer 200 can for a given height, and thus it is possible to more efficiently change the electric field. Thus, even if the level difference of the organic layer 174 is not large, the electric field can be changed efficiently by making the dielectric constant of the planarization layer 192 higher than that of the liquid-crystal layer 200.

The spacer 191 and the planarization layer 192 may be made of the same material. In addition, the spacer 191 and the planarization layer 192 may be formed via the same process. In this case, the same mask may be used to form the spacer 191 and the planarization layer 192. In some embodiments, however, different masks may be used.

A first alignment layer (not shown) may be additionally disposed on the pixel electrode 180 and the planarization layer 192. The first alignment layer may control an initial orientation angle of the liquid crystal molecules 210 injected into the liquid-crystal layer 200. In some embodiments, the first alignment layer may be eliminated.

Subsequently, the second display substrate 300 will be described.

The second display substrate 300 includes a second base substrate 310, a light-blocking element 320, an overcoat layer 330, and a common electrode 340.

The second base substrate 310 may be disposed such that it faces the first base substrate 110. The second base substrate 310 may have durability so that it can withstand external impact. The second base substrate 310 may be a transparent insulating substrate. For example, the second base substrate 310 may be a glass substrate, a quartz substrate, a transparent resin substrate, etc. The second base substrate 310 may have a flat plate shape, although it may be curved in a particular direction.

The light-blocking element 320 may be disposed on a surface of the second base substrate 310 facing the first display substrate 100. The light-blocking element 320 may be disposed such that it overlaps with the gate line 122, the data line 162, the thin-film transistor 167 and the contact hole CNT, i.e., it overlaps the other areas than the active area AA, thereby blocking light transmission in the other area than the active area AA. However, this is merely illustrative. In some embodiments, the light-blocking element 320 may be disposed in the areas other than the active area AA, except some areas of the data lines 162 disposed adjacent to the pixel electrode 180.

The overcoat layer 330 is disposed on a surface of the light-blocking element 320 facing the first display substrate 100. The overcoat layer 330 may reduce a level difference created by the light-blocking element 320. In some embodiments, the overcoat layer 330 may be eliminated.

The common electrode 340 is disposed on a surface of the overcoat layer 330 facing the first display substrate 100.

The common electrode 340 may be made of a transparent conductive material such as indium tin oxide (ITO), indium zinc oxide (IZO), indium tin zinc oxide (ITZO) and Al-doped zinc oxide (AZO).

The common electrode 340 may be formed throughout the entire surface of the second base substrate 310 as a sheet of plate. The common electrode 340 may receive a common voltage from an external source and may form electric field across the liquid-crystal layer 200 together with the pixel electrode 180.

The common voltage may be supplied from an external source, and the level of the common voltage may be maintained while the LCD device is driven. Accordingly, electric field may be formed between the pixel electrode 180 and the common electrode 340 overlapping each other due to a level difference between the data voltage supplied to the pixel electrode 180 and the common voltage supplied to the common electrode 340. The liquid crystals LC may be rotated or tilted by the electric field.

Incidentally, as described above, the distance between the pixel electrode 180 and the common electrode 340 may differ depending on the positions in the active area AA. Herein, the distance between the pixel electrode 180 and the common electrode 340 refers to a distance measured in the direction perpendicular to the first base substrate 110.

More specifically, in the first area SA1, the distance equal to the height dt2 of the liquid-crystal layer 200 is formed between the pixel electrode 180 and the common electrode 340. On the other hand, in the second area SA2 and the third area SA3, the distance equal to the height dt2 of the liquid-crystal layer 200 plus the height dt1 of the organic layer 174 is formed between the pixel electrode 180 and the common electrode 340. Accordingly, even if one voltage level is applied to each of the pixel electrode 180 and the common electrode 340, the intensity of the electric field formed in the liquid-crystal layer 200 disposed in the first area SA1 is greater than the intensity of the electric field formed in the second area SA2 and the third area SA3. As a result, even if one voltage level is provided to the pixel electrode 180, the liquid-crystal molecules 210 disposed in the first area SA1 may be tilted more than the liquid-crystal molecules disposed in the second area SA2 and the third area SA3. Accordingly, the first area SA1 can be seen brighter than the second area SA2 and the third area SA3.

In addition, as described above, since the level difference of the organic layer 174 extends perpendicularly with respect to the directions in which the branch electrodes 182 are extended in the first to fourth domains DM1 to DM4, the liquid-crystal molecules 210 disposed around the boundary where the inclination of the liquid-crystal molecules 210 changes are controlled so that they are tilted in the same direction. In other words, the liquid-crystal molecules 210 disposed on the boundaries between the first area SA1 and the second area SA2 and between the first area SA1 and the third area SA3 are not controlled so that they are tilted in the opposite directions, but are controlled so that they are tilted in the same direction at different angles. Accordingly, the liquid-crystal molecules 210 are controlled so that the inclinations of the liquid-crystal molecules 210 differ from area to area. As a result, the collision between the liquid-crystal molecules 210 is reduced, and accordingly the transmittance can be improved.

Hereinafter, the liquid-crystal layer 200 will be described.

The liquid-crystal layer 200 may include liquid-crystal molecules 210 having dielectric anisotropy and refractive anisotropy. The liquid-crystal molecules 210 may be aligned perpendicularly with respect to the first display substrate 100 and the second display substrate 300 when no electric field is formed across the liquid-crystal layer 200. When electric field is formed between the first display substrate 100 and the second display substrate 300, the liquid crystal molecules 210 may be rotated or tilted in a particular direction between the first display substrate 100 and the second display substrate 300 to thereby change the polarization of light.

Hereinafter, the effects of improving the visibility and transmittance of a liquid-crystal display device achieved by an exemplary embodiment of the present disclosure will be described.

Figure 6:
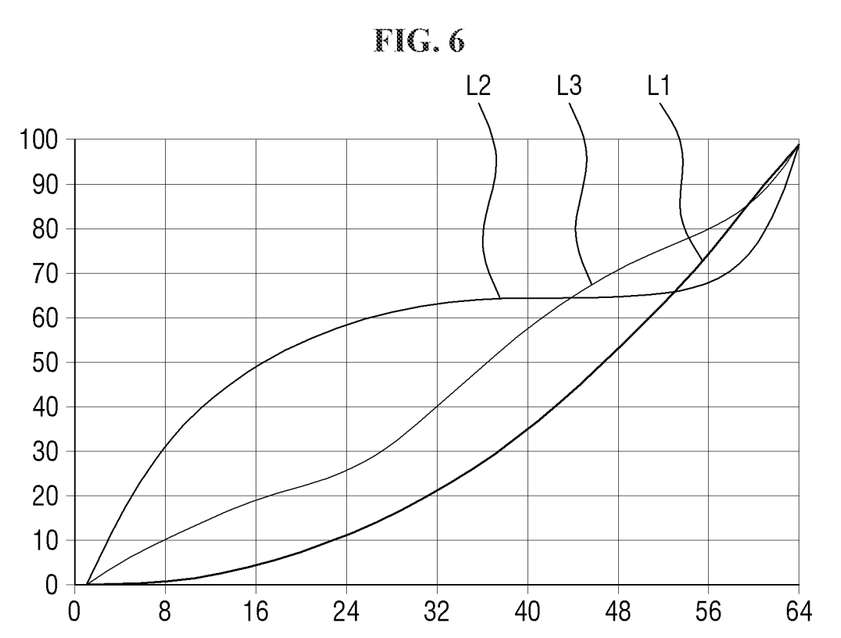
FIG. 6 is a graph showing the improvement of the visibility of the liquid-crystal display device according to the exemplary embodiment shown in FIG. 1 over Comparative Example.

FIG. 6 is a graph showing the improvement of the visibility of a liquid crystal display device according to the exemplary embodiment shown in FIG. 1 over Comparative Example.

In the graph of FIG. 6, the x-axis represents the grayscale of each of the pixels 10, and the y-axis represents the brightness in [%]. In this graph, the maximum value of brightness is defined as the maximum brightness of a liquid-crystal crystal display having grayscale levels of 0 to 63 when it is viewed from the front.

Referring to FIG. 6, a first line L1 represents the brightness versus grayscale of a liquid-crystal display device according to Comparative Example when viewed from the front, a second line L2 represents the brightness versus grayscale of the liquid-crystal display device according to Comparative Example when viewed from a side thereof, and a third line L3 represents the brightness versus grayscale of the liquid-crystal display device including the pixels 10 according to the exemplary embodiment shown in FIG. 1 when viewed from a side thereof.

The liquid-crystal display device according to Comparative Example includes a pixel electrode having a stem electrode having a '+' shape and a plurality of branch electrodes extending in four directions from the stem electrode, all of which are disposed substantially in the same plane.

In the graph, It is to be understood that the liquid-crystal display devices exhibit better visibility as the measurement of the brightness versus grayscale when viewed from the side is closer to the measurement of the brightness versus grayscale when viewed from the front. As used herein, the visibility refers to the difference in brightness between the front and the side for the gamma 2.2 curve. When the visibility is converted into the visibility index, a smaller value indicates a better visibility. That is, among the measurements on the brightness versus grayscale when viewed from the side, the visibility index of a line closer to the first line L1 has a smaller value and thus has better visibility. In particular, it is to be understood that in the range of low grayscale levels of 0 to 40, the visibility is better as the measurement is closer to the first line L1.

In the graph of FIG. 6, the third line L3 is closest to the first line L1. In particular, in the range of low grayscale levels of 0 to 40, the measurements of the third line L3 maintain lower grayscale levels than the second line L2. In addition, the second line L2 has the visibility index of 0.44 while the third line L3 has the visibility index of 0.28. Therefore, the measurement conditions according to the third line L3, that is, the liquid-crystal display device including the structure of the pixel electrode 180 shown in FIG. 1 can have relatively improved visibility.

Figure 7:
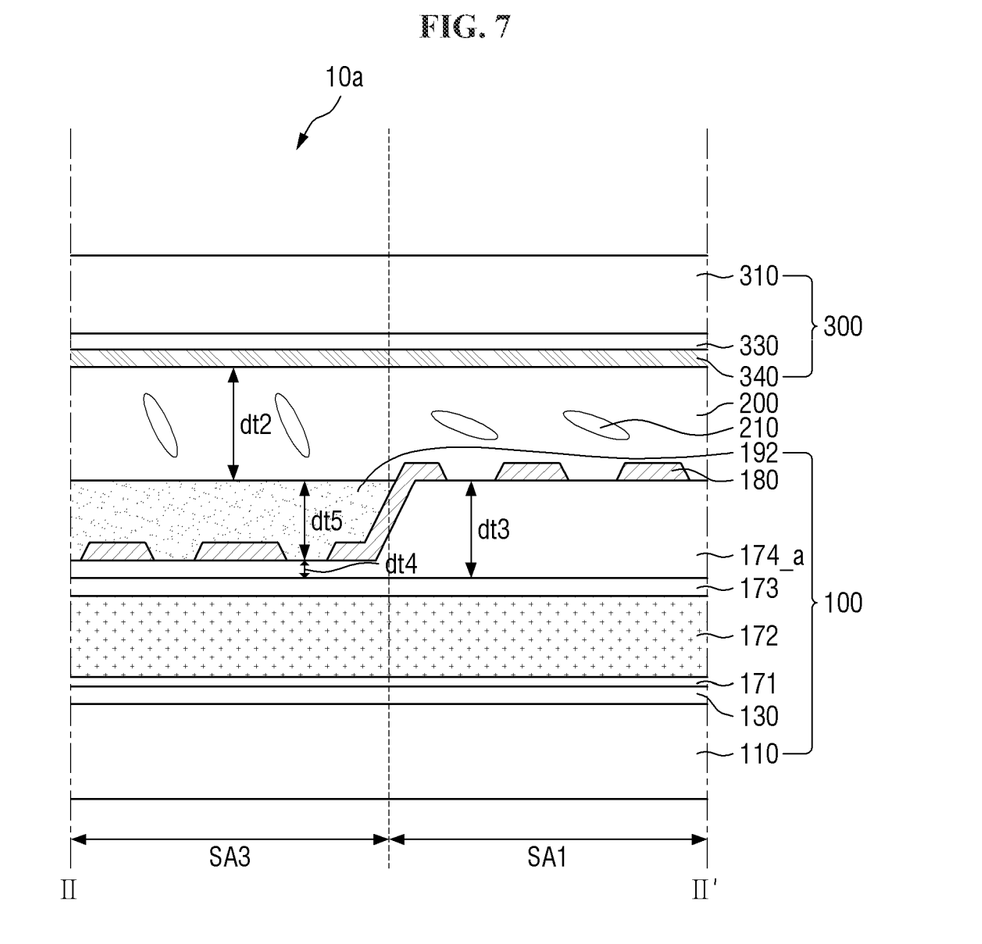
FIG. 7 is a cross-sectional view of a pixel of a liquid-crystal display device according to another exemplary embodiment, taken along line II-II' of FIG. 1.

FIG. 7 is a cross-sectional view of a pixel of a liquid-crystal display device according to another exemplary embodiment of the present disclosure, taken along line II-II' of FIG. 1.

A pixel 10a of the liquid-crystal display device according to this exemplary embodiment is different from the pixel 10 of the liquid-crystal display device according to the exemplary embodiment shown in FIG. 1 in that an insulating layer 174_a has a different structure. In the following description, descriptions will be focused on differences, and the redundant description will be omitted.

The insulating layer 174_a of the pixel 10a of the liquid-crystal display device according to this exemplary embodiment of the present disclosure may have a certain height even in the second area SA2 and the third area SA3. That is, the insulating layer 174_a may be formed in all of the first area SA1, the second area SA2 and the third area SA3, and the height dt3 thereof in the first area SA1 may be larger than the height dt4 thereof in the second area SA2 and the third area SA3. Thus, a level difference may be created in the insulating layer 174_a at the boundaries between the first area SA1 and the second and between the first area SA1 and the third area SA3.

The height dt5 of the level difference created in the insulating layer 174_a may be calculated by subtracting the height dt4 of the insulating layer 174_a formed in the second area SA2 and the third area SA3 from the height dt3 of the insulating layer 174_a formed in the first area SA1. The height dt5 of the level difference created in the insulating layer 174_a may be 0.5 μm or more. In particular, when the height dt5 of the level difference created in the insulating layer 174_a is 1 μm or more, the visibility can be most improved.

The insulating layer 174_a may be formed in the manufacturing process using a slit mask, a halftone mask, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A liquid-crystal display device, comprising:
a substrate on which a plurality of pixels is defined, wherein each of the pixels comprises an active area where transmittance of light is controlled;
an organic layer disposed on the substrate; and
a pixel electrode disposed on the substrate and the organic layer,
wherein the active area of each pixel consists of a first area, a second area, and a third area, wherein the first area is hexagonal or diamond shaped, the second area is connected to only two sides of the first area, and the third area is connected to only an opposite two sides of the first, respectively, when viewed from a top,
wherein the organic layer is disposed only in the first area, and
wherein a level of the pixel electrode disposed in the first area is higher than a level of the pixel electrode disposed in the second area and the third area by a height of the organic layer.

2. The liquid-crystal display device of claim 1, further comprising:
a planarization layer disposed on the pixel electrode, wherein the planarization layer is disposed in the second area and the third area.

3. The liquid-crystal display device of claim 2, wherein an upper surface of the organic layer and an upper surface of the planarization layer are substantially flat and disposed on a same level.

4. The liquid-crystal display device of claim 3, further comprising:
a spacer disposed on the pixel electrode, wherein the spacer and the planarization layer are made of a same material.

5. The liquid-crystal display device of claim 2, further comprising:
a liquid-crystal layer disposed on the pixel electrode,
wherein a dielectric constant of the planarization layer is greater than a dielectric constant of the liquid-crystal layer.

6. The liquid-crystal display device of claim 1, further comprising:
a liquid-crystal layer disposed on the pixel electrode; and
a common electrode disposed on the liquid-crystal layer,
wherein a level difference between the pixel electrode and the common electrode in the first area is smaller than a level difference between the pixel electrode and the common electrode in the second area and the third area.

7. The liquid-crystal display device of claim 6, wherein the level difference between the pixel electrode and the common electrode in the first area is different from the level difference between the pixel electrode and the common electrode in the second area and the third area by a height of the organic layer.

8. The liquid-crystal display device of claim 1, wherein a height of the organic layer is equal to or greater than 0.5 μm.

9. The liquid-crystal display device of claim 1, wherein the pixel electrode further comprises a stem electrode extended in a first direction and a second direction perpendicular to the first direction, and branch electrodes each extended from the stem electrode,
wherein a boundary between the first area and the second area and a boundary between the first area and the third area are perpendicular to directions in which the branch electrodes are extended.

10. A liquid-crystal display device, comprising:
a substrate on which a plurality of pixels is defined, wherein each of the pixels comprises an active area where transmittance of light is controlled;
an organic layer disposed on the substrate; and
a pixel electrode disposed on the substrate and the organic layer,
wherein the active area of each pixel consists of a first area, a second area, and a third area, wherein the first area is hexagonal or diamond shaped, the second area is connected to only two sides of the first area, and the third area is connected to only an opposite two sides of the first area, respectively, when viewed from a top,
wherein a height of the organic layer disposed in the first area is higher than a height of the organic layer disposed in each of the second area and the third area, and
wherein a level of the pixel electrode disposed in the first area is higher than a level of the pixel electrode disposed in the second area and the third area by a difference between the heights of the organic layer.

11. The liquid-crystal display device of claim 10, further comprising:
a planarization layer disposed on the pixel electrode,
wherein the planarization layer is disposed in the second area and the third area.

12. The liquid-crystal display device of claim 11, wherein an upper surface of the organic layer and an upper surface of the planarization layer are substantially flat and disposed on a same level.

13. The liquid-crystal display device of claim 12, further comprising:
a spacer disposed on the pixel electrode,
wherein the spacer and the planarization layer are made of a same material.

14. The liquid-crystal display device of claim 11, further comprising:
a liquid-crystal layer disposed on the pixel electrode,
wherein a dielectric constant of the planarization layer is greater than a dielectric constant of the liquid-crystal layer.

15. The liquid-crystal display device of claim 10, further comprising:
a liquid-crystal layer disposed on the pixel electrode; and
a common electrode disposed on the liquid-crystal layer,
wherein a level difference between the pixel electrode and the common electrode in the first area is smaller than a level difference between the pixel electrode and the common electrode in the second area and the third area.

16. The liquid-crystal display device of claim 10, wherein a difference between the height of the organic layer disposed in the first area and the height of the organic layer disposed in the second area and the third area is equal to or greater than 0.5 μm.

17. The liquid-crystal display device of claim 10, wherein the pixel electrode comprises a stem electrode extended in a first direction and a second direction perpendicular to the first direction, and branch electrodes each extended from the stem electrode,
wherein a boundary between the first area and the second area and a boundary between the first area and the third area are perpendicular to directions in which the branch electrodes are extended.

18. The liquid-crystal display device of claim 10, wherein the organic layer is formed using a halftone mask or a slit mask.

* * * * *